United States Patent [19]

Hohnerlein

[11] Patent Number: 4,921,156
[45] Date of Patent: May 1, 1990

[54] SOLDERING APPARATUS

[76] Inventor: Ernst Hohnerlein, Ringstrasse 7, 6983 Kreuzwertheim, Fed. Rep. of Germany

[21] Appl. No.: 265,232

[22] Filed: Oct. 31, 1988

[30] Foreign Application Priority Data

Nov. 5, 1987 [DE] Fed. Rep. of Germany ....... 3737563

[51] Int. Cl.$^5$ .............................................. B23K 3/00
[52] U.S. Cl. ...................................... 228/37; 228/42; 228/43; 427/432
[58] Field of Search .......... 228/180.1, 180.2, 218–220, 228/260, 37, 42, 43, 56.1; 427/432

[56] References Cited

U.S. PATENT DOCUMENTS 4,254,158 3/1981 Fukuzuka et al. ................... 427/432
4,412,641 11/1983 Fuchs et al. ........................... 228/37

FOREIGN PATENT DOCUMENTS 1777016 1/1971 Fed. Rep. of Germany .
3309648 9/1984 Fed. Rep. of Germany .
8520254 12/1985 Fed. Rep. of Germany .
 76660 5/1984 Japan ..................................... 228/37
59-163071 9/1984 Japan .

Primary Examiner—Richard K. Seidel
Assistant Examiner—Samuel M. Henrich
Attorney, Agent, or Firm—W. G. Fasse; D. H. Kane, Jr.

[57] ABSTRACT

The soldering arrangement has a lengthwise extending tunnel arrangement (1) with a soldering tunnel (3) through which a conveyor arrangement (10) for the work pieces extends. A soldering tunnel (3) which is inclined upwardly in the conveying direction is provided with a floor opening which is surrounded by a downwardly protruding sealing skirt (18) which is immersed in the molten liquid solder material (20) in a tub (19) below the soldering tunnel (3). The soldering nozzles (24, 25) arranged within the soldering tunnel (3) are supplied through riser channels within the sealing skirt (18). A protective gas conduit (41) for supplying nitrogen opens into the soldering tunnel (3). The soldering tunnel (3) and the conveyor path of the conveyor arrangement (10) extending within the soldering tunnel (3), are tiltable about a horizontal crosswise axis (47), whereby the inclination of the soldering tunnel (3) is adjustable.

17 Claims, 3 Drawing Sheets

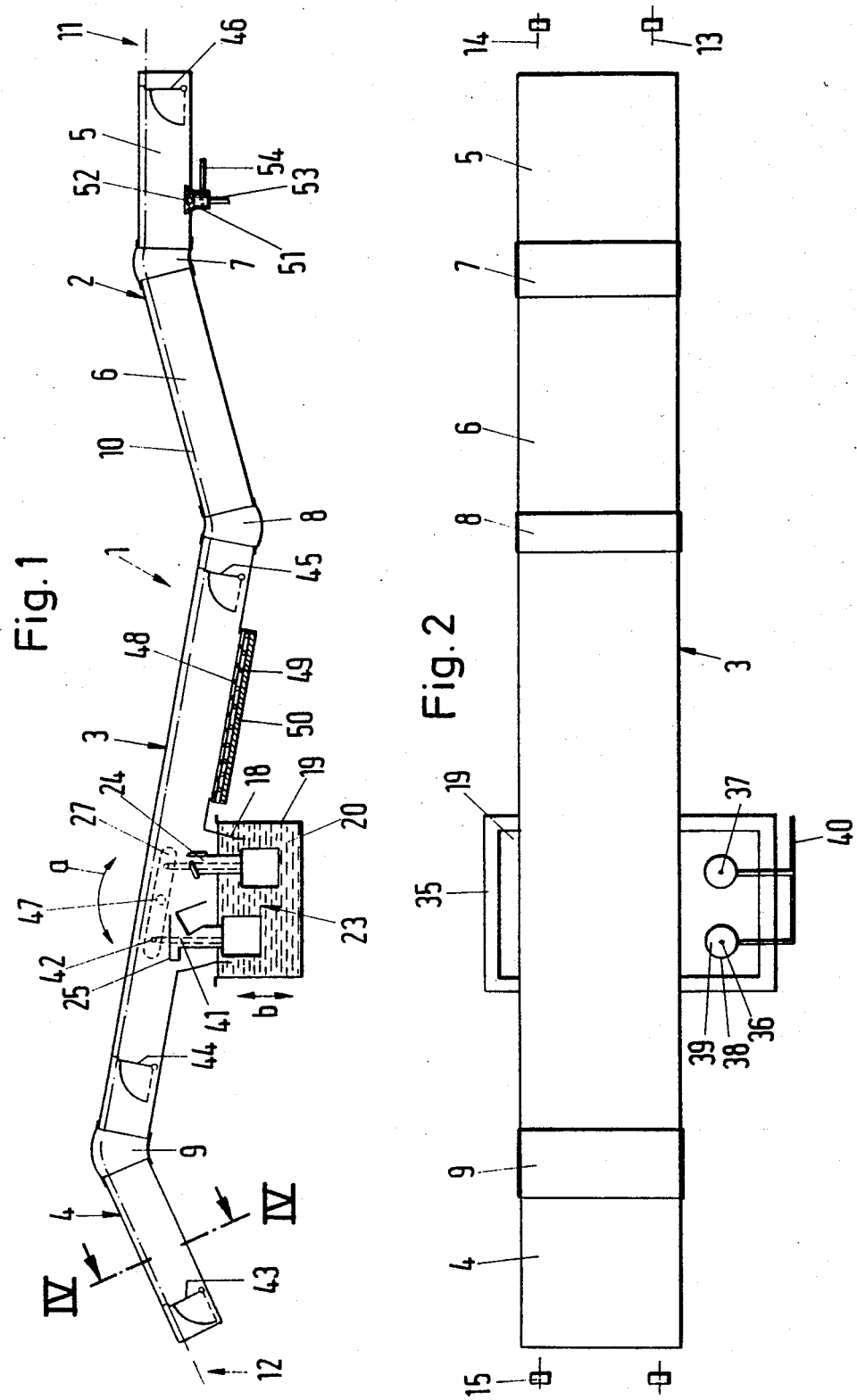

SOLDERING APPARATUS

CROSS-REFERENCE TO RELATED APPLICATION

The present application is related to my copending application U.S. Ser. No. 07/265,233; filed on Oct. 31, 1988, entitled: METHOD AND APPARATUS FOR APPLYING A FLUX MATERIAL.

FIELD OF THE INVENTION

The invention relates to a soldering apparatus, especially for producing soldered connections on the backside of a printed circuit board carrying electronic components.

BACKGROUND OF THE INVENTION

Soldering machines of this type include a middle soldering tunnel enclosing a soldering chamber between an entry tunnel and an exit tunnel. A conveyor arrangement transports the work pieces to be provided with soldered connection through the entry tunnel, through the soldering tunnel, and through the exit tunnel, whereby the conveying path inclines upwardly in the conveying direction within the soldering chamber. A conduit for a protective gas opens into the soldering chamber. The gas is preferably nitrogen. A tub for a molten pool of solder material is arranged below the conveying path in the area of the soldering chamber. The tub is provided with a heating arrangement and with at least one circulating pump. At least one soldering nozzle with an upwardly directed nozzle opening is arranged within the soldering chamber for producing a swell out of the circulated solder material for contacting the work pieces caused to move above and past the nozzle opening.

The just described soldering apparatus with a protective gas atmosphere in the soldering chamber is known from German Utility Model Publication (DE-GM) No. 8,520,254. Atmospheric oxygen is excluded from the soldering location by means of the protective gas, whereby the soldering quality may be considerably increased because the atmospheric oxygen would lead to an embrittlement of the surfaces of the soldering points or locations. Furthermore, the apparatus has a lengthwise extension due to the sequential arrangement of the tunnels one behind the other thereby achieving a high soldering output capacity because all of the soldered connections to be formed on the downwardly slanting backside of circuit boards, are formed as they pass by the swell of solder material, whereby the circumstance that the solder is only deposited on the metallic conductors passing through the circuit board to its backside, is utilized.

In the known soldering apparatus nitrogen to which, however, hydrogen has been added is used as a protective gas. This hydrogen has a reducing effect and can bond with any oxygen still remaining in the soldering chamber in spite of the protective gas atmosphere. However, at the entry end and at the exit end of the tunnel arrangement the danger exists that an explosive mixture will be formed due to mixing with air. For this reason sluice locks are provided at the ends of the tunnel arrangement and the sluice lock chambers are emptied of air or protective gas by being pumped out after each sluice lock operation. As a result, the apparatus becomes complicated, whereby the output capacity is comparatively small because the need to pass the work pieces through sluice locks does not allow a continuous operation of the conveyor arrangement with a high velocity matched to the soldering operation.

A further disadvantage of the known apparatus exists in that the soldering tunnel comprises a housing extension in its middle region with a comparatively large soldering chamber. A tub for the molten pool of solder is located in the soldering chamber. This housing extension not only contradicts the compact construction, but also leads to a relatively large soldering chamber volume and therewith protective gas volume. Furthermore, a relatively high temperature exists in the soldering chamber because the molten solder material is applied at approximately 250° C. Correspondingly, all the components arranged for the tub of the molten pool and within the soldering chamber such as the drive means for circulating the solder material, and, if necessary, means for the height adjustment of the tub with the soldering nozzle, are subjected to these high temperatures which has disadvantageous effects.

OBJECTS OF THE INVENTION

It is the object of the invention to make the soldering apparatus simpler, to have a higher output capacity, and to be better adaptable to the respective requirements depending on the work piece without having to accept any negative effects of atmospheric oxygen nor any loss of soldering quality caused by such oxygen.

SUMMARY OF THE INVENTION

These objects are achieved according to the invention in that the tub is arranged below the tunnel floor of the soldering chamber, the tunnel floor of the soldering chamber comprises a floor opening, the soldering nozzle with its supply channel protrudes upwardly out of the tub through the floor opening into the soldering chamber, and the housing floor is provided with a sealing skirt enclosing the floor opening and protruding downwardly into the tub to be immersed in the molten pool.

In this embodiment the soldering chamber is completely integrated into the soldering tunnel which does not comprise any housing expansion and which may be embodied with an essentially invariable tunnel cross-section which preferably corresponds to that of the entry tunnel and of the exit tunnel. In this manner a relatively small soldering chamber results for which the filling quantity of protective gas is correspondingly small. The molten pool tub is arranged outside of the soldering chamber, whereby the connection to the soldering chamber is established through the floor opening and the sealing skirt which may be made of stainless steel and which forms a problem free and sure seal against the penetration of air into the soldering chamber. With this arrangement of the tub outside of the soldering chamber and the provision of an immersed seal by means of the sealing skirt, relative movements between the tub and the soldering tunnel may be carried out without any problems, whereby corresponding components including the drive motor for the circulating pump of the molten solder material are not subjected to any or only to small temperature loads. By using a neutral protective gas such as nitrogen, costly sluice lock arrangements at the ends of the tunnel arrangement become unnecessary, especially if a long tunnel arrangement is selected and the protective gas is introduced into the soldering chamber at a slight excess pressure. In this manner the soldering chamber or the soldering zone may be maintained in an absolutely air free condition.

The above emphasized possibility of relative movement between the molten pool tub and the soldering tunnel may be utilized in that the soldering tunnel and the conveyor path arranged in the soldering chamber is tiltable about a horizontal crosswise axis for varying the conveyor path inclination. Different inclination angles of the conveyor arrangement with a correspondingly changed slope of the backsides of the circuit boards which come into contact with the solder material swell lead to differing soldering characteristics and make possible a simple adaptation to the respective conditions. In this context a steeper angle leads to a reduced solder application while a flatter angle means a greater application of solder. Moreover, the slope of the soldering tunnel is also significant for the exclusion of atmospheric oxygen. Air is heavier than the protective gas (nitrogen) so that any entering air collects at the low lying locations of the tunnel arrangement. This circumstance may also be utilized through a sloped arrangement of the entry tunnel and of the exit tunnel.

BRIEF DESCRIPTION OF THE DRAWINGS

An example embodiment of the invention will be described in more detail in the following with reference to the accompanying drawings wherein:

FIG. 1 shows a partially sectioned side view of the present soldering apparatus;

FIG. 2 shows a top view onto the soldering apparatus according to FIG. 1;

Figure 3:
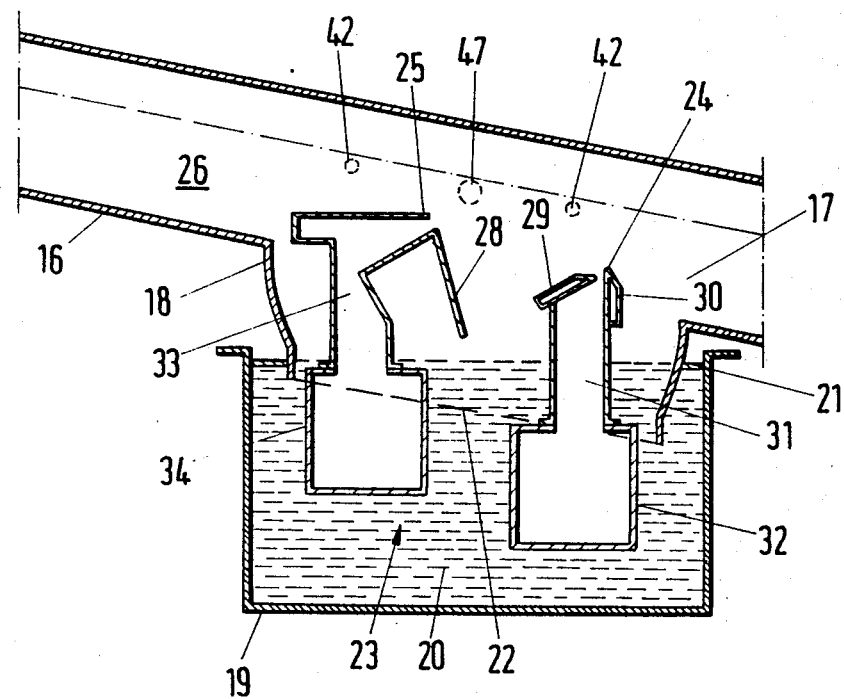
FIG. 3 shows an enlarged portion of FIG. 1.

DETAILED DESCRIPTION OF PREFERRED EXAMPLE EMBODIMENTS AND OF THE BEST MODE OF THE INVENTION

The present soldering apparatus comprises a machine frame, drives, and supply arrangements which are not shown in the drawings and which are basically known as such. The apparatus comprises as an essential component, a lengthwise extending tunnel arrangement 1 which includes an entry tunnel 2, a soldering tunnel 3, and an exit tunnel 4. The entry tunnel 2 is divided into two tunnel sections 5 and 6 of which the tunnel section 5 forms the entry section. The tunnel sections 5 and 6 are connected to each other in the same way as the tunnels 2, 3, and 4 by means of flexible bellows 7, 8, and 9.

Figure 4:
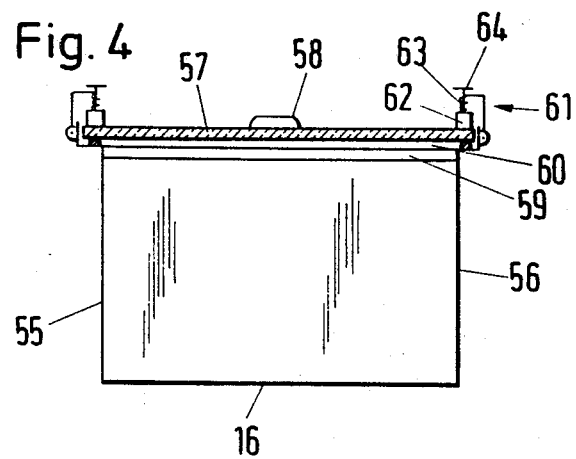
FIG. 4 shows a section along the line IV—IV of FIG. 1.

A conveyor arrangement 10 extends through the tunnel arrangement and is only shown in FIG. 1 as the conveyor path by a dash-dotted line. The conveyor arrangement 10 extends outside of the tunnel arrangement 1 at both ends thereby forming a loading station 11 and a removal station 12 for loading by suspending and for removing respectively the work pieces such as circuit boards on which soldering operations are to be carried out. Corresponding to the throughput direction of the work pieces in FIG. 1 from the right to the left, the tunnel section 5 is essentially horizontal, the tunnel section 6 slopes downwardly in the conveying direction, the soldering tunnel 3 preferably slopes upwardly in the conveying direction, and the exit tunnel 4 is preferably arranged to slope downwardly in the conveying direction. The conveying arrangement 10 extends in a corresponding appropriate manner along a zig-zag path. As shown in FIG. 2, the conveying arrangement 10 comprises two parallel lateral conveyor strands or runs 13 and 14 on which mounting means 15 are arranged in alignment with each other by means of which the work pieces or circuit boards may be tightly clamped at opposite sides so that they are held in suspension on the conveyor arrangement 10 for transporting through the tunnel arrangement 1. The tunnel arrangement comprises an essentially rectangular cross-section along its entire length having a comparatively smaller height as shown in FIG. 4.

As may be seen especially in FIG. 3, the tunnel floor 16 of the soldering tunnel 3 comprises a floor opening 17 in a middle lengthwise area which is surrounded by a downwardly protruding sealing skirt 18. A tub 19 is arranged below the floor opening 17. The tub 19 is provided with a heating arrangement which is not shown and contains the molten pool of liquid solder material 20. As shown, the sealing skirt 18 is immersed through the surface level 21 of the molten pool into the liquid solder material 20 so that the bottom skirt edge 22 is arranged completely under the surface level 21 of the molten pool.

For applying the solder to the downwardly tilting bottom side of the work pieces, a soldering arrangement 23 is provided with at least one soldering nozzle. In the example embodiment shown two soldering nozzles 24 and 25 are provided each comprising a horizontal nozzle slot extending perpendicularly to the soldering tunnel 3. The soldering nozzles 24 and 25 have different constructions and orientations, whereby the soldering nozzle 24 acts as an application nozzle and the soldering nozzle 25 located downstream in the transportation direction acts as a stripping nozzle. The nozzles 24 and 25 are arranged within the soldering chamber 26 enclosed by the soldering tunnel 3 above the surface level 21 of the molten pool. They determine the soldering zone or soldering path 27 shown in FIG. 1. While the soldering nozzle 25 comprises a run-off flange 28 tilting downwardly toward the surface level 21 of the molten pool, the soldering nozzle 24 is provided with guide flanges 29 and 30. The soldering nozzle 24 is connected by a riser channel 31 protruding through the surface level 21 of the molten pool, to a supply channel 32 extending in the crosswise direction within the tub 19. In a corresponding manner a riser channel 33 and a supply channel 34 are arranged for the soldering nozzle 25.

As can be seen in FIG. 2, the tub 19 arranged within an insulation jacket 35, extends perpendicular to the soldering tunnel 3 and protrudes therefrom essentially on one side. There, a respective circulation pump is arranged for each supply channel 32 and 34. Operation of the respective circulation pumps causes a swell of liquid solder material to be emitted from the two soldering nozzles 24 and 25, whereby the solder swell comes into contact with the bottom side of the work pieces passing by transported by the conveyor arrangement 10.

In FIG. 2, only the two drive shafts 36 and 37 of these pumps are visible. The drive shafts 36 and 37 extend vertically through the surface level 21 of the molten pool and are provided with a drive motor at their upper end and carry a pump wheel at their lower end. Each drive shaft 36 and 37 is provided with a reverse cup-shaped pot 38 of which the upwardly facing pot bottom 39 is penetrated by the drive shaft 36 or 37 in a gas-tight manner and of which the downwardly extending cylindrical rim is immersed in the liquid solder material 20 similarly to the sealing skirt 18. Nitrogen is supplied through a nitrogen conduit 40 to both pots 38 so that no air and thereby no oxygen remains in the pots 38. In this manner it is prevented that air penetrates along the drive shafts 36 and 37 into the solder material 20 and is then pumped to the soldering nozzles 24 or 25. Moreover, any strongly corrosive attack on the drive shafts by the hot molten liquid solder material 20 in the presence of oxygen, is thereby prevented.

Two further protective gas conduits 41 through which nitrogen streams at a slight excess pressure through the exit openings 42 (FIG. 3) into the soldering chamber 26, are shown in FIG. 1. The supplied nitrogen fills the entire tunnel arrangement 1 including the space surrounded by the sealing skirt 18 above the surface level 21 of the molten pool and thereby prevents the admission of air to the soldering path area 27. In order to prevent the nitrogen from streaming out of the tunnel arrangement and mixing with air, four seal flaps 43, 44, 45, and 46 are provided for essentially closing the tunnel cross-section as shown in FIG. 1. The seal flaps 43, 44, 45, and 46 are tilted open in the transport direction by the passing work pieces or the conveyor arrangement 10 and thereafter close again. With the above described features, it is possible to maintain the oxygen concentration in the area of the soldering path 27 below 3 ppm which is essential for a high soldering quality.

The soldering tunnel 3 is tiltable about a horizontal crosswise axis 47 as is indicated in FIG. 1 by the bowed double arrow by means of an adjustment arrangement which is not shown in detail. In this manner the slope of the soldering tunnel 3 and therewith also the sloped inclination of the work pieces transported through the soldering tunnel 3 may be adapted to the respective conditions. A change in slope may be carried out without problems because the bellows 7, 8, and 9 take up any positional changes in the tunnel arrangement 1 and because the sealing skirt immersed in the liquid soldering material 20 ensures that air does not penetrate into the soldering chamber 26 in spite of a relative movement between the soldering tunnel 3 and the tub 19. For this reason, a simple height adjustment, corresponding to the double arrow b in FIG. 1, of the tub 19 is possible by means of an adjustment arrangement, not shown, whereby the soldering nozzles 24 and 25 may be moved into an advantageous position relative to the transport path of the conveyor arrangement 10 or relative to the passing work pieces.

As can be seen in FIG. 1, a glass ceramic plate 48 is built into the tunnel floor 16 of the soldering tunnel 3 in front of the sealing skirt 18 in the transport direction. Electrical heater rods 49 are arranged on the bottom side of the glass ceramic plate 48 and are insulated downwardly by insulation 50. The work pieces which are moved forward through the soldering tunnel 3 are heated by means of the heater rods 49 to such an extent that damage due to a sudden temperature increase in the area of the soldering path 27 is prevented.

A spray arrangement 51 with an ultrasonic atomizer nozzle 52 is arranged according to FIG. 1 in the floor of the tunnel section 5 in order to apply a flux onto the bottom sides of the work pieces. This spray arrangement is more closely described in my simultaneously filed Patent Application entitled ."'METHOD AND APPARATUS FOR APPLYING A FLUX MATE-RIAL". The ultrasonic atomizing nozzle 52 atomizes a flux which is delivered through a supply conduit 53 with essentially no pressure. The flux is typically a nature or modified resin containing additives including an acid and having a reducing effect on the metal surfaces to be soldered. It is intended that instead of the previously used fluxes applied in a foam state which lead to excessive smearing and soiling of the apparatus, a pure adipic acid without additives is to be applied as a flux in the form of a powder. The powder is dissolved in ethyl alcohol as a 1% solution forming a highly fluid form to be fogged by means of the ultrasonic atomizing nozzle 52 and applied onto the work piece bottom surface by means of an airstream which surrounds the fog in a ring-shape. For this purpose a compressed air conduit 54 is connected to the spraying arrangement 51.

The tunnel structure which can be seen in FIG. 4, essentially pertains without variations for the entire tunnel arrangement 1 or for the tunnels 2, 3, and 4. Accordingly, the, or rather each tunnel comprises a floor 16 and two tunnel walls 55 and 56 protruding upwardly from the floor 16 and which are preferably made of light gage sheet metal. The top of the tunnel is essentially formed as a row of removable see through glass plates 57 of manageable length in the longitudinal direction of the tunnel arrangement 1 and which are provided with a handle 58 at their narrow edges. At the contact area between neighboring see through glass plates, the tunnel walls 55 and 56 are connected to each other by cross-struts 59. The cross-struts 59 together with the upper edges of the tunnel walls 55 and 56 form a continuous contact rest surface against which the see through glass plates 57 are pressed in a sealing manner with an interplaced continuous closed sealing strip 60.

In order to tightly press down the see through glass plates 57, quick lock means are tiltably arranged at spacings along both tunnel sides along the upper edge of the tunnel wall 55 or 56. Each quick lock means 61 comprises a pressure member 62 which presses the see through glass plate 57 against the sealing strip 60 in the operating position as shown by means of a spring 63. The pressure member may be lifted against the spring force by means of a release handle 64 and the quick lock means 61 may be laterally tilted away. Plates of safety glass (wire mesh glass) are provided as the see through glass plates 57. In the area of the soldering path 27 and also in the area of the heater rods 49, see through glass plates of temperature resistant glass ceramic are provided. These features enable an optical monitoring along the entire tunnel arrangement 1, especially also in the area of the soldering path 27, and allow a rapid access whenever necessary at any position along the tunnel arrangement 1 by removing the appropriate see through glass plate 57. The individual see through glass plates 57 and quick lock means 61 are not shown in FIGS. 1 and 2.

Figure 5:
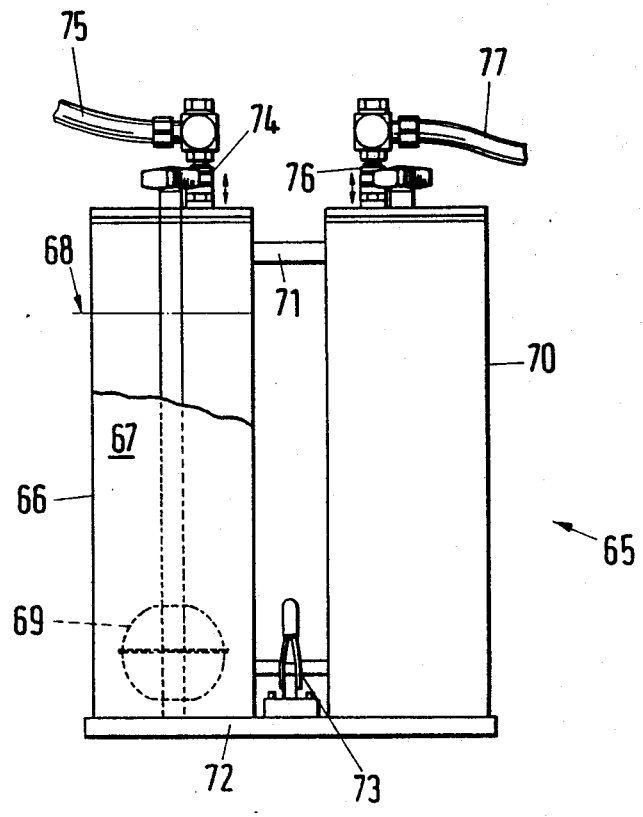
FIG. 5 shows an exchange unit for delivery of the reduction medium in a side view.

Despite the substantial reliability with which air and therewith atmospheric oxygen is excluded from the soldering path 27 by means of the prescribed features, a reducing agent may be added to the protective gas (nitrogen) as an additional preventive measure. Advantageously for that purpose an exactly dosable portion of the nitrogen delivered to the soldering chamber 26 through the protective gas conduit 41 is branched off and is loaded with formic acid in gaseous form acting as a reducing agent. An enrichment arrangement 65 which may be used for this purpose is shown in FIG. 5. The enrichment arrangement 65 which may be located basically at any desired position of the apparatus, comprises a reducing agent container 66 with a refill chamber 67 for the liquid formic acid of which the maximum filling level is shown at 68. A float ball 69 signals that the minimum filling level has been reached and therewith the necessity to switch containers or to refill with formic acid. A droplet separating container 70 is arranged in conjunction with the reducing agent container 66. The containers 66 and 70 are interconnected through an overflow conduit 71 and are connected by a mounting 72 to form a unit which is secured or released by means of a quick lock arrangement 73 for exchange with an appropriately refilled unit. That can be carried out during a short duration shutting off of the nitrogen supply without interrupting the soldering operation. For that purpose the quick screw connection 74 between the nitrogen supply conduit 75 and the reducing agent container 66, and the quick screw connection 76 between the droplet separator container 70 and the nitrogen exhaust conduit 77 are to be loosened and, after exchanging the units, are to be again tightly screwed together. It has been determined that flowing a small nitrogen throughflow through the enrichment arrangement 65, for example, a throughflow of 5 l/min is sufficient to deliver a sufficient quantity of gaseously absorbed formic acid to the soldering chamber 26.

Although the invention has been described with reference to specific example embodiments it will be appreciated that it is intended to cover all modifications and equivalents within the scope of the appended claims.

What I claim is:

1. A soldering apparatus for producing soldered connections on at least one side of printed circuit boards carrying electronic components, comprising a soldering tunnel (3) enclosing a soldering chamber (26) between an entry tunnel section (2) and an exit tunnel section (4), a conveyor arrangement (10) for transporting said printed circuit boards through said entry tunnel section (2), through said soldering tunnel (3) and through said exit tunnel section (4) along a conveyor path of said conveyor arrangement, a conduit (41) opening into said soldering chamber (26) for supplying a protective gas into said soldering chamber, a heated tub (19) for holding a pool (20) of molten solder material, said pool being arranged below said path of said conveyor arrangement in the area of said soldering chamber (26), at least one circulating pump for circulating the molten solder material, at least one soldering nozzle (24, 25) within said soldering chamber (26), said soldering nozzle having an upwardly directed nozzle opening for producing a swell of molten solder material, said swell contacting said printed circuit boards moving past and over said nozzle opening, said tub (19) being arranged below a floor (16) of said soldering chamber (26), an opening (17) in said floor (16) of said soldering chamber (26), molten solder supply channel means mounting said soldering nozzle to protrude upwardly out of said tub (19) through said floor opening (17) in said soldering chamber (26), and sealing skirt means (18) enclosing said floor opening (17) and protruding downwardly into said tub (19) sufficiently for immersing into said pool (20) of molten solder material.

2. The soldering apparatus according to claim 1, wherein said soldering tunnel (3) with said conveyor path in said soldering chamber (26) is tiltable about a horizontal crosswise axis (47) for varying a conveyor path inclination.

3. The soldering apparatus according to claim 1, wherein each of said entry tunnel section (2) and said exit tunnel section (4) has a downward slope relative to said soldering tunnel (3) as viewed in a travel direction of said conveyor arrangement, said soldering tunnel (3) sloping upwardly as viewed in said travel direction.

4. The soldering apparatus according to claim 1, wherein said entry tunnel section (2) comprises two entry tunnel portions (5, 6) which extend at an angle relative to each other, one of said two entry tunnel portions forming a first section as viewed in a travel direction of said conveyor arrangement, said first section extending essentially horizontally.

5. The soldering apparatus according to claim 1, further comprising gas-tight flexible bellows (7, 8, 9) for operatively interconnecting neighboring tunnel sections of said tunnel with each other.

6. The soldering apparatus according to claim 1, wherein said circulating pump comprises a drive shaft immersed in said pool (20) of molten solder material outside of said sealing skirt (18), and a coaxial cup-shaped pot (38) opening downwardly, said pot having a floor (39) through which said drive shaft extends in a gas-tight manner, said pot having a wall immersed in said pool (20) of molten solder material, said apparatus further including a conduit (40) for feeding protective gas into said pot (38).

7. The soldering apparatus according to claim 1, wherein said heated tub (19) with the soldering nozzle (24, 25) is height adjustable relative to said soldering tunnel (3).

8. The soldering apparatus according to claim 1, wherein an area of said soldering tunnel floor (16) in front of said sealing skirt (18), as viewed in the transport direction of said conveyor arrangement, comprises a glass ceramic plate (48), and a heater rod arrangement (49) provided under said glass ceramic plate.

9. The soldering apparatus according to claim 1, further comprising applicator means for applying a flux onto said printed circuit boards carried forward by said conveyor arrangement (10), said applicator means being located in a tunnel floor in front of said sealing skirt (18) as viewed in the transport direction.

10. The soldering apparatus according to claim 1, further comprising tunnel side walls and upper cross-struts interconnecting said tunnel side walls, removable see through glass plates (57) forming tops of said tunnels (2, 3, 4), and continuous sealing strips (60) sealing said removable see through glass plates (57) against said tunnel side walls (55, 56) and against said upper cross-struts (59).

11. The soldering apparatus according to claim 10, wherein said see through glass plates (57) are made of glass ceramic.

12. The soldering apparatus according to claim 1, further comprising means (65) for supplying a reducing agent into said protective gas conduit (41).

13. The soldering apparatus according to claim 12, wherein said means (65) for supplying a reducing agent comprises an easily installable and removable exchangeable unit (66, 70) with a refill chamber (67) for said reducing agent and a separating chamber for reducing agent droplets, and wherein said protective gas successively flows through said chambers.

14. The soldering apparatus according to claim 12, wherein said reducing agent is formic acid.

15. The soldering apparatus according to claim 1, wherein said protective gas is nitrogen.

16. The soldering apparatus according to claim 9, wherein said flux applicator means are arranged in a floor portion of said entry tunnel (2).

17. The soldering apparatus according to claim 10, wherein said see through glass plates are made of safety gas.

* * * * *

UNITED STATES PATENT AND TRADEMARK OFFICE
CERTIFICATE OF CORRECTION

PATENT NO. : 4,921,156
DATED : May 1, 1990
INVENTOR(S) : Ernst Hohnerlein

It is certified that error appears in the above-identified patent and that said Letters Patent is hereby corrected as shown below:

Claim 17, Column 8, line 67, replace "gas" by --glass--.

Signed and Sealed this

Fourth Day of June, 1991

Attest:

HARRY F. MANBECK, JR.

Attesting Officer

Commissioner of Patents and Trademarks